(12) United States Patent
Lee et al.

(10) Patent No.: US 9,204,557 B2
(45) Date of Patent: Dec. 1, 2015

(54) ENVIRONMENTAL SENSITIVE ELECTRONIC DEVICE PACKAGE AND MANUFACTURING METHOD THEREOF

(71) Applicant: Industrial Technology Research Institute, Hsinchu (TW)

(72) Inventors: Hsiao-Yen Lee, Taipei (TW); Yu-Yang Chang, Hsinchu County (TW); Pao-Ming Tsai, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 251 days.

(21) Appl. No.: 14/073,875

(22) Filed: Nov. 7, 2013

(65) Prior Publication Data

US 2014/0160705 A1    Jun. 12, 2014

Related U.S. Application Data

(60) Provisional application No. 61/733,907, filed on Dec. 6, 2012.

(30) Foreign Application Priority Data

Jun. 10, 2013    (TW) .............................. 102120560 A

(51) Int. Cl.
*H05K 1/00* (2006.01)
*H05K 3/28* (2006.01)
*G06F 1/16* (2006.01)
*H01L 51/52* (2006.01)

(52) U.S. Cl.
CPC .............. *H05K 3/284* (2013.01); *G06F 1/1652* (2013.01); *H01L 51/5246* (2013.01); *H01L 2251/5338* (2013.01); *Y10T 29/49888* (2015.01)

(58) Field of Classification Search
USPC ........................... 361/679.01, 749–750, 782; 174/254–259; 313/495–512
See application file for complete search history.

(56) References Cited

U.S. PATENT DOCUMENTS 7,652,424 B2    1/2010    Park et al.
8,093,512 B2    1/2012    Chen et al.
(Continued)

FOREIGN PATENT DOCUMENTS

TW          201037799          10/2010

OTHER PUBLICATIONS

Zhang et al., "Effect of Encapsulation on OLED Characteristics with Anisotropic Conductive Adhesive", 2nd Electronics System-Integration Technology Conference, Sep. 2008, p. 613-p. 616.
(Continued)

*Primary Examiner* — Tuan T Dinh
(74) *Attorney, Agent, or Firm* — Jianq Chyun IP Office

(57) ABSTRACT

An environmental sensitive electronic device package including a first substrate, a second substrate, an environmental sensitive electronic device, gas barrier structures, micro-structures, and a filler layer is provided. The second substrate is located above the first substrate. The environmental sensitive electronic device is located on the first substrate. The gas barrier structures may be located between the first substrate and the second substrate and surround the environmental sensitive electronic device. The gas barrier structures have a first height. The micro-structures may be located between the first substrate and the second substrate and have a second height. A ratio of the second height to the first height ranges from 1/250 to 1/100. The filler layer may be located between the first substrate and the second substrate and covers the gas barrier structures and the environmental sensitive electronic device. A manufacturing method of an environmental sensitive electronic device package is also provided.

30 Claims, 8 Drawing Sheets

100A

(56) References Cited

U.S. PATENT DOCUMENTS

| | | | |
|---|---|---|---|
| 2009/0167132 A1 | 7/2009 | Bae et al. | |
| 2010/0258346 A1 | 10/2010 | Chen et al. | |
| 2011/0037059 A1* | 2/2011 | Gyoda | H01L 27/3276 257/40 |
| 2012/0064278 A1 | 3/2012 | Chen | |
| 2012/0114910 A1* | 5/2012 | Ju | B82Y 40/00 428/172 |
| 2012/0138342 A1* | 6/2012 | Muramoto | G02B 1/11 174/254 |
| 2014/0139985 A1* | 5/2014 | Shih | H05K 5/063 361/679.01 |

OTHER PUBLICATIONS

Sang et al., "Thin Film Encapsulation for OLED Display using Silicon Nitride and Silicon Oxide Composite Film", 2011 International Conference on Electronic Packaging Technology & High Density Packaging, Aug. 2011, p. 1175-p. 1178.

van der Wel et al., "B-DRY®: Edge Sealant for Sensitive Photovoltaic Modules", 37th IEEE Photovoltaic Specialists Conference, Jun. 2011, p. 001371-p. 001374.

Fu et al., "Room Temperature Plasma Assisted Atomic Layer Deposition Al2O3 Film's Encapsulation Application in Organic Light Emitting Diodes", ISDRS 2011, Dec. 2011, p. 1-p. 2.

Li et al., "Thin Film Encapsulation of OLED Displays with Organic-Inorganic Composite Film", 58th Electronic Components and Technology Conference, May 2008, p. 1819-p. 1824.

Wang et al., "Direct Encapsulation of Organic Light-Emitting Devices (OLEDs) Using Photo-Curable co-Polyacrylate/Silica Nanocomposite Resin", IEEE Transactions on Advanced Packaging, Aug. 2007, vol. 30, p. 421-p. 427.

"Office Action of Taiwan Counterpart Application", issued on Sep. 22, 2015, pp 1-9, in which the listed foreign reference was cited.

* cited by examiner

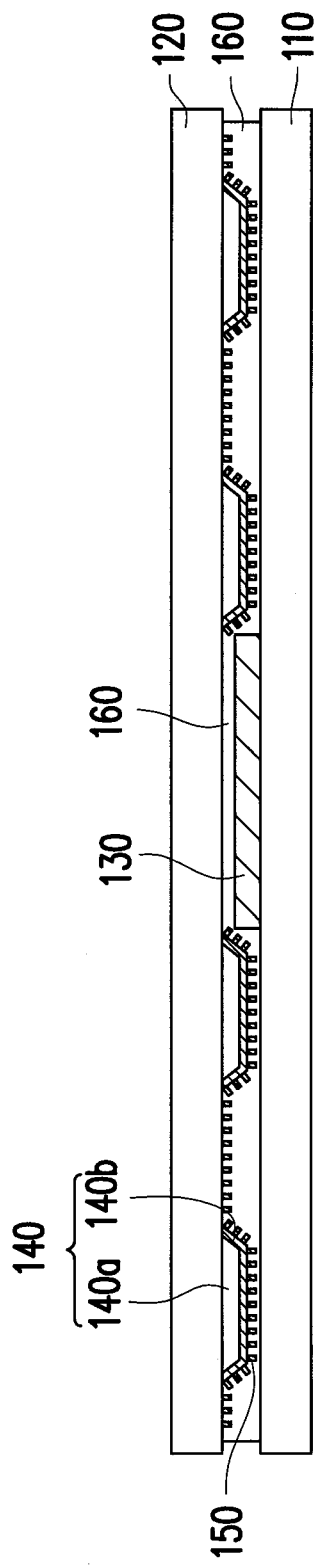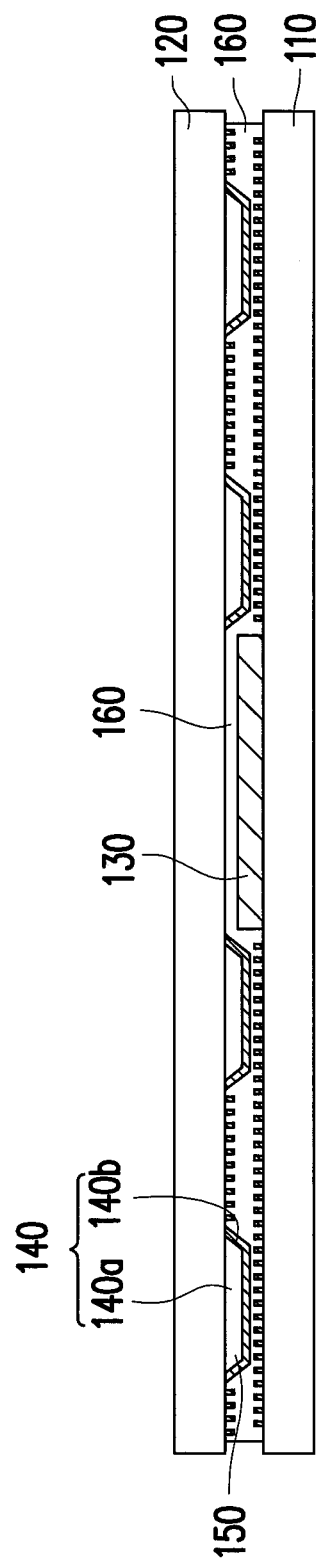

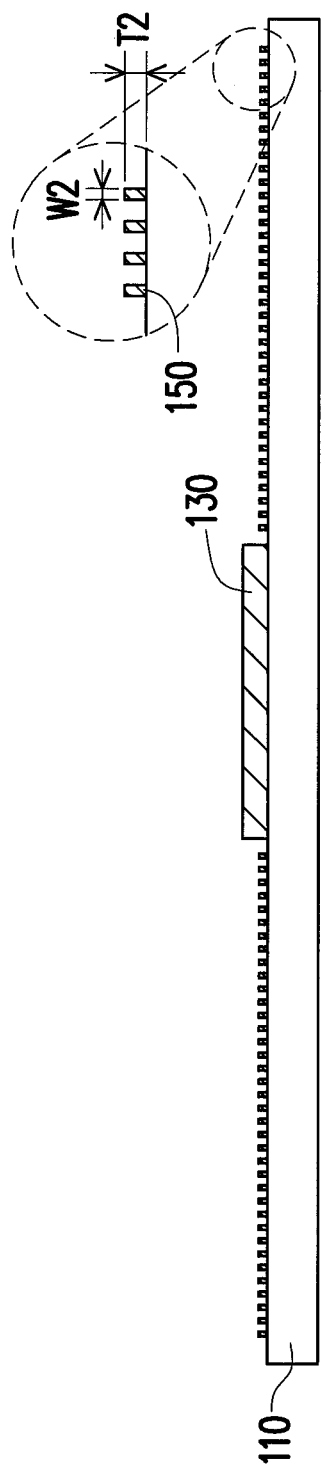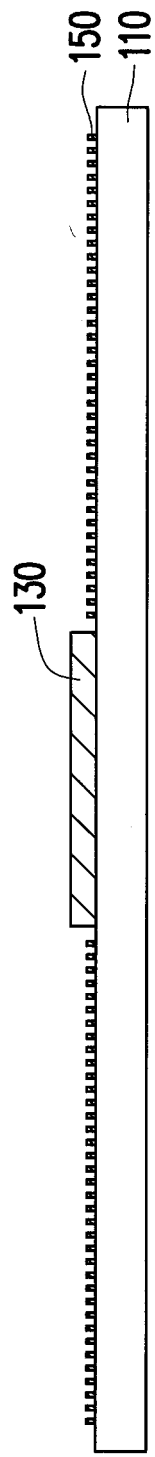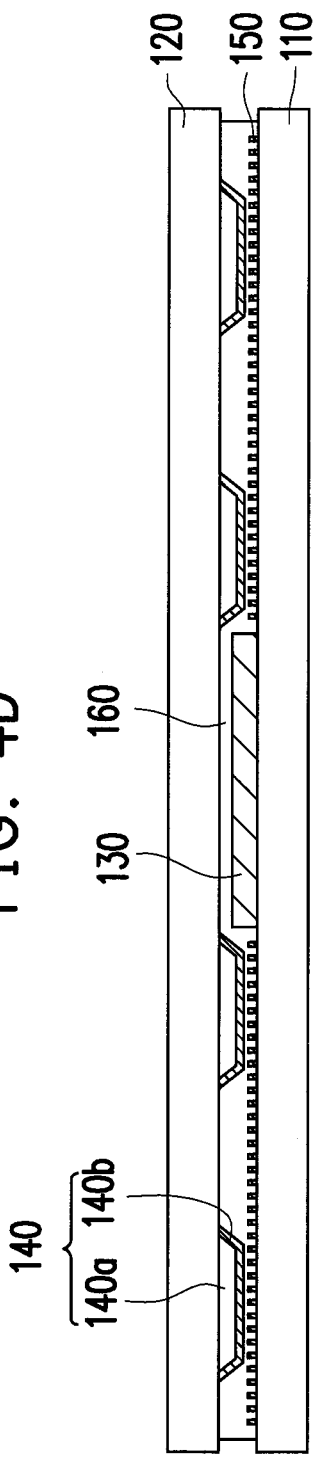

ENVIRONMENTAL SENSITIVE ELECTRONIC DEVICE PACKAGE AND MANUFACTURING METHOD THEREOF

CROSS-REFERENCE TO RELATED APPLICATION

This application claims the priority benefits of U.S. provisional application Ser. No. 61/733,907, filed on Dec. 6, 2012 and Taiwan application serial no. 102120560, filed on Jun. 10, 2013. The entirety of each of the above-mentioned patent applications is hereby incorporated by reference herein and made a part of this specification.

TECHNICAL FIELD

The technical field relates to a package and a manufacturing method thereof, an environmental sensitive electronic device package and a manufacturing method thereof.

BACKGROUND

With the progress of display technology, displays have been developed in the trend of slimness and planarization, and flexible displays (for example, foldable displays) have gradually become the next-generation displays. The flexible substrates are characterized by bendability, ease of carriage, compliance with safety standards, and extensive applications in consumer products. The flexible substrates also have large coefficient of thermal expansion and poor resistance to heat, moisture, oxygen, and chemicals. A flexible substrate may serve to hold electronic devices and/or act as a cover, so as to perform a packaging process on the electronic devices. Since the flexible substrate may not block permeation of moisture infiltration and oxygen, the moisture infiltration and the oxygen diffusion may speed up the aging process of the electronic devices on the flexible substrate. As a result, the lifetime of the electronic devices is shortened, and thereby the market demand cannot be satisfied.

A side wall barrier structure may be employed to enhance the ability of the flexible display to block moisture and oxygen. The side wall barrier structure is formed on the flexible substrate and is adhered to another flexible substrate by means of an adhesive. If the thickness of the adhesive between the side wall barrier structure and the flexible substrate is significant, the adhesion between the side wall barrier structure and the flexible substrate may be improved, whereas possibility of permeation of water vapor/oxygen increases.

SUMMARY

According to an exemplary embodiment of the disclosure, an environmental sensitive electronic device package includes a first substrate, a second substrate, an environmental sensitive electronic device, at least one gas barrier structures, a plurality of micro-structures, and a filler layer. The second substrate is located above the first substrate. The environmental sensitive electronic device is located on the first substrate and between the first substrate and the second substrate. The gas barrier structures are located between the first substrate and the second substrate and surround the environmental sensitive electronic device. Here, each of the gas barrier structures has a first height. The micro-structures are located between the first substrate and the second substrate, and each of the micro-structures has a second height. A ratio of the second height to the first height ranges from 1/250 to 1/100. The filler layer is located between the first substrate and the second substrate and covers the gas barrier structures and the environmental sensitive electronic device.

An exemplary embodiment of the disclosure provides a manufacturing method of an environmental sensitive electronic device package, and the manufacturing method includes: forming an environmental sensitive electronic device on a first substrate; forming at least one gas barrier structures on the first substrate and/or the second substrate, wherein the gas barrier structure surround the environmental sensitive electronic device, and each of the gas barrier structures has a first height; configuring a plurality of micro-structures between the first substrate and the second substrate, and each of the micro-structures has a second height, wherein a ratio of the second height to the first height ranges from 1/250 to 1/100; forming a filler layer on the first substrate to cover the environmental sensitive electronic device and the gas barrier structures; laminating the second substrate onto the filler layer, such that the first substrate is bonded with the second substrate through the filler layer and the environmental sensitive electronic device and the gas barrier structures are located between the first substrate and the second substrate.

Several exemplary embodiments accompanied with figures are described in detail below to further describe the disclosure in details.

BRIEF DESCRIPTION OF DRAWINGS

The accompanying drawings are included to provide further understanding, and are incorporated in and constitute a part of this specification. The drawings illustrate exemplary embodiments and, together with the description, serve to explain the principles of the disclosure.

FIG. 2A to FIG. 2D are schematic cross-sectional diagrams illustrating an environmental sensitive electronic device package according to another exemplary embodiment of the disclosure.

FIG. 4A to FIG. 4E are schematic cross-sectional diagrams illustrating a manufacturing method of an environmental sensitive electronic device package according to an exemplary embodiment of the disclosure.

DETAILED DESCRIPTION OF DISCLOSED EMBODIMENTS

Figure 1A:
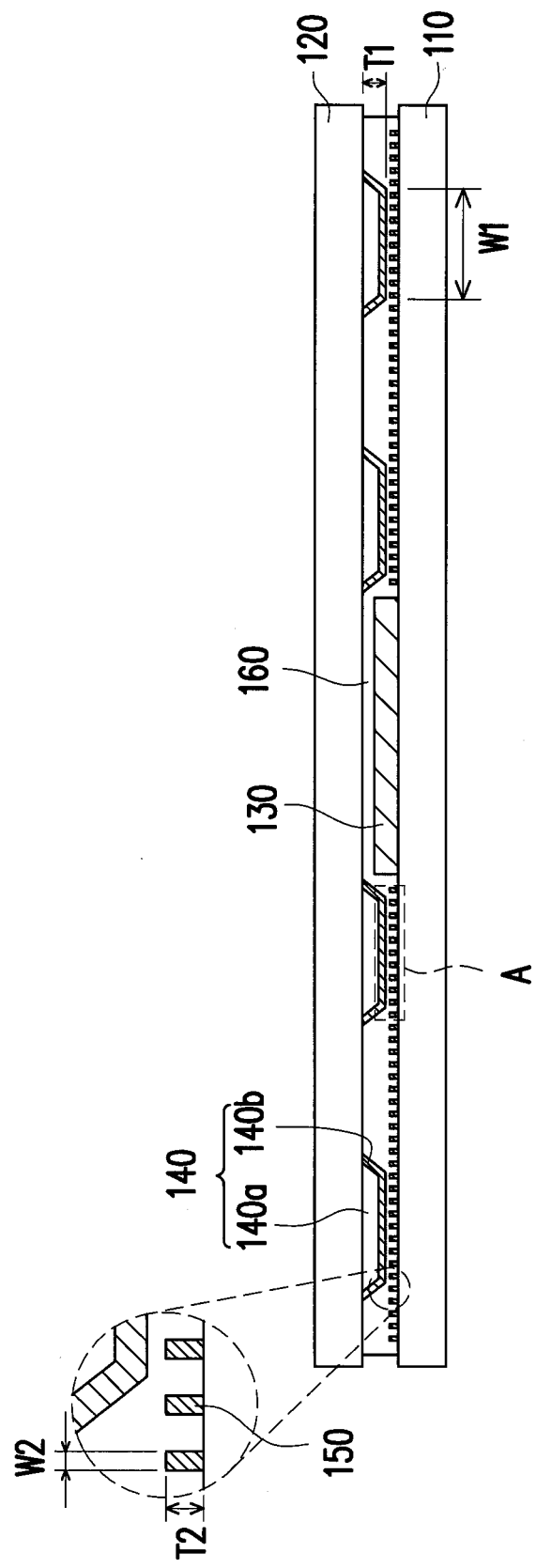
FIG. 1A is a schematic cross-sectional diagram illustrating an environmental sensitive electronic device package according to an exemplary embodiment of the disclosure.

An exemplary embodiment of the disclosure provides an environmental sensitive electronic device package and a manufacturing method thereof. An exemplary embodiment of the disclosure provides an environmental sensitive electronic device package and a manufacturing method thereof to resolve an issue of a shortened service lifetime of an environmental sensitive electronic device and prevent delamination of the environmental sensitive electronic device package caused by bending the environmental sensitive electronic device package.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
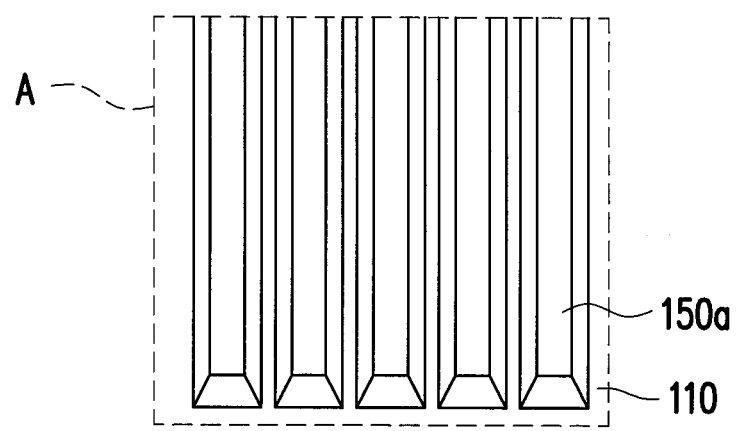
FIG. 1B to FIG. 1D are partial top views illustrating a region A in the environmental sensitive electronic device package depicted in FIG. 1A.
Figure 1C:
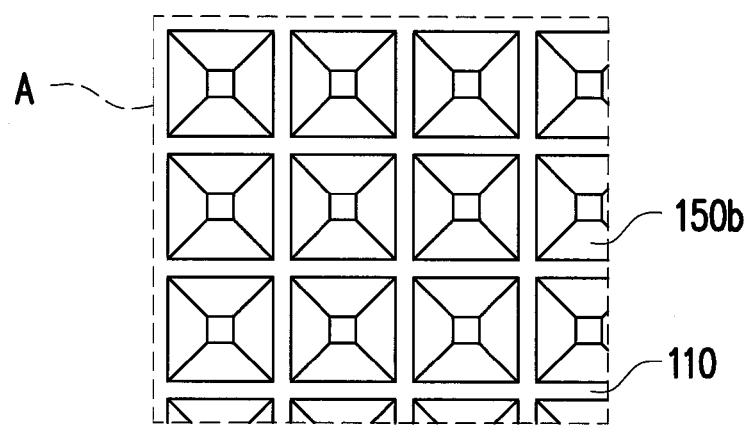
Figure 1D:
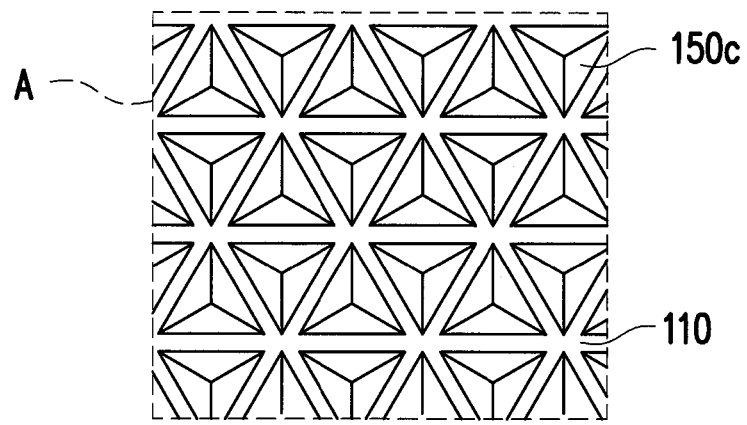

FIG. 1A is a schematic cross-sectional diagram illustrating an environmental sensitive electronic device package according to an exemplary embodiment of the disclosure. FIG. 1B to FIG. 1D are partial top views illustrating a region A in the environmental sensitive electronic device package depicted in FIG. 1A. With reference to FIG. 1A, in the present exemplary embodiment, the environmental sensitive electronic device package 100A includes a first substrate 110, a second substrate 120, an environmental sensitive electronic device 130, at least one gas barrier structures 140, a plurality of micro-structures 150, and a filler layer 160. The second substrate 120 is located above the first substrate 110. The environmental sensitive electronic device 130 is located on the first substrate 110 and between the first substrate 110 and the second substrate 120. The gas barrier structures 140 are located between the first substrate 110 and the second substrate 120 and surround the environmental sensitive electronic device 130. Here, each of the gas barrier structures 140 has a first height T1 that ranges from 20 micrometers to 25 micrometers, for instance. The micro-structures 150 are located between the first substrate 110 and the second substrate 120, and each of the micro-structures 150 has a second height T2. A ratio of the second height T2 to the first height T1 ranges from 1/250 to 1/100. The filler layer 160 is located between the first substrate 110 and the second substrate 120 and covers the gas barrier structures 140 and the environmental sensitive electronic device 130.

In the present exemplary embodiment, the first substrate 110 and the second substrate 120 are flexible substrates, for instance, and a material of the flexible substrates may be polyethylene terephthalate (PET), polyethylene naphthalate (PEN), polyethersulfone (PES), polymethyl methacrylate (PMMA), polycarbonate (PC), polyimide (PI), or metal foil. Besides, the flexible substrates may be equipped with the touch functions, such as surface capacitive touch substrates, digital matrix touch substrates (e.g., projected capacitive touch substrates), or analog matrix touch substrates. The first substrate 110 and the second substrate 120 may also be rigid substrates made of glass, which should not be construed as a limitation to the disclosure.

Besides, the environmental sensitive electronic device 130 is, for instance, an active environmental sensitive electronic display device or a passive environmental sensitive electronic display device. The active environmental sensitive electronic display device is, for instance, an active matrix organic light emitting diode (AM-OLED), an active matrix electrophoretic display (AM-EPD) commonly known as electronic paper, an active matrix liquid crystal display (AM-LCD), or an active matrix blue phase liquid crystal display (AMBPLCD). The passive environmental sensitive electronic display device is, for instance, a passive matrix OLED (PM-OLED) or a super twisted nematic liquid crystal display (STN-LCD).

The gas barrier structures 140 may be located on at least one side of the environmental sensitive electronic device 130 or located on any three sides of the environmental sensitive electronic device 130. The gas barrier structures 140 may surround the environmental sensitive electronic device 130. In the present exemplary embodiment, each of the gas barrier structures 140 has a first width W1, and a ratio of the first width W1 to the first height T1 ranges from 4 to 6. A water vapor transmission rate of the gas barrier structures 140 is less than $10^{-2}$ g/m$^2$/day. Each of the gas barrier structures 140 may include a rib 140a and a barrier layer 140b. As shown in FIG. 1A, the ribs 140a described in the present exemplary embodiment are located on the second substrate 120 and are equidistantly arranged, for instance. Here, a shape of a cross-section of each rib 140a perpendicular to the first substrate 110 may be a rectangular shape, a trapezoidal shape, or a triangular shape, and the barrier layers 140b cover the ribs 140a. In the present exemplary embodiment, the cross-section of each rib 140a perpendicular to the first substrate 110 has the trapezoidal shape. In general, a material of the ribs 140a includes an inorganic material or a hybrid organic-inorganic material; a material of the barrier layers 140b includes an inorganic material, e.g., silicon nitride ($SiN_x$), silicon oxide ($SiO_x$), silicon oxynitride ($SiN_xO_y$), or aluminum oxide ($Al_2O_3$). The material of the barrier layers 140b is, for instance, molybdenum (Mo), titanium (Ti), aluminum (Al), chromium (Cr), Mo/Al/Mo arranged in multiple metallic layers, or Ti/Al/Ti arranged in multiple metallic layers.

In another exemplary embodiment that is not shown herein, the gas barrier structures 140 may have roughened surfaces. The gas barrier structures 140 with the roughened surfaces have the ribs 140a with roughened surfaces and the barrier layers 140b covering the ribs 140a, and the ribs 140a with the roughened surfaces are formed by dry etching, wet etching, or sandblasting (that produces a matte finish), for instance.

With reference to FIG. 1A, in the present exemplary embodiment, the micro-structures 150 are formed on the first substrate 110 through photolithography, X-ray lithography, laser etching, or screen printing, for instance. Each of the micro-structures 150 has a second width W2, and a ratio of the second width W2 to the second height T2 ranges from 1/10 to 1. As shown in FIG. 1B to FIG. 1D, the micro-structures 150 are protrusions with polygonal bottom areas, and the bottom areas of the micro-structures 150 may be shaped as a rectangle (marked as 150a in FIG. 1B), a square (marked as 150b in FIG. 1C), or a triangle (marked as 150c in FIG. 1D), for instance. That is, the micro-structures 150a shown in FIG. 1B are cuboids with the rectangular bottom areas, the micro-structures 150b shown in FIG. 1C are cubes with the square bottom areas, and the micro-structures 150c shown in FIG. 1D are pyramids with the triangular bottom areas, for instance. In other exemplary embodiments that are not shown herein, the bottom areas of the micro-structures 150 may be shaped as other types of polygons, circles, or ellipses.

The filler layer 160 is formed by an adhesive that is cured by ultraviolet light or heat, for instance. The adhesive is, for instance, made of acrylic or epoxy resin. In the present exemplary embodiment, the filler layer 160 is a pressure-sensitive-type adhesive or a fill-type adhesive, for instance. The structural design or the configuration of the micro-structures 150 described herein may be adjusted in response to the gas left in the adhesive, so as to discharge the remaining gas from the adhesive.

The micro-structures 150 are able to increase the contact surface area between the first substrate 110 and the filler layer 160, so as to enhance the reliability of the environmental sensitive electronic device package 100A. From another perspective, the micro-structures 150 on the first substrate 110 may be in point, line, or surface contact with or may almost touch the barrier layers 140b of the gas barrier structures 140, and thereby possibility of permeation of water vapor/oxygen may decrease.

In the previous exemplary embodiment, the gas barrier structures 140 are located on the second substrate 120, the micro-structures 150 are located on the first substrate 110, and the cross-section of each rib 140a of the gas barrier structures 140 perpendicular to the first substrate 110 has the trapezoidal shape. In other exemplary embodiments, any different structural design or configuration that may prevent moisture infiltration and oxygen diffusion is still deemed an applicable technical scheme and falls within the scope of protection provided in the disclosure. The following are descriptions of different exemplary embodiments detailing different designs of environmental sensitive electronic device packages 100B to 100I.

Figure 2A:
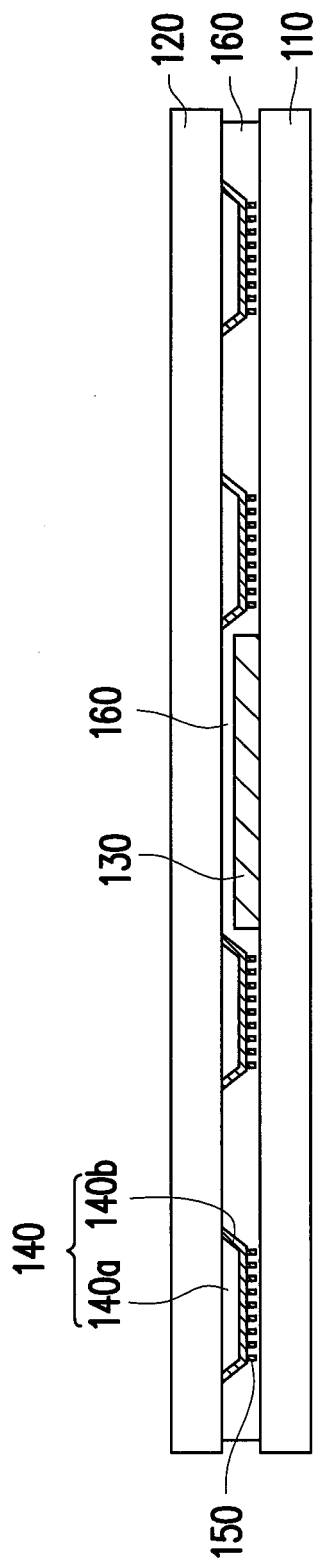

FIG. 2A to FIG. 2D are schematic cross-sectional diagrams illustrating an environmental sensitive electronic device package according to another exemplary embodiment of the disclosure. FIG. 3A to FIG. 3D are schematic cross-sectional diagrams illustrating an environmental sensitive electronic device package according to another exemplary embodiment of the disclosure. The environmental sensitive electronic device package 100B shown in FIG. 2A is similar to the environmental sensitive electronic device package 100A shown in FIG. 1A, while one of the differences therebetween lies in that the micro-structures 150 of the environmental sensitive electronic device package 100B shown in FIG. 2A are merely located on top surfaces of the gas barrier structures 140 close to the first substrate 110. That is, the micro-structures 150 are capable of expanding the contact surface area between the gas barrier structures 140 and the filler layer 160, so as to enhance the reliability of the environmental sensitive electronic device package 100B. The micro-structures 150 may be in point, line, or surface contact with or may almost touch the first substrate 110, and thereby possibility of permeation of water vapor/oxygen may significantly decrease.

Figure 2B:
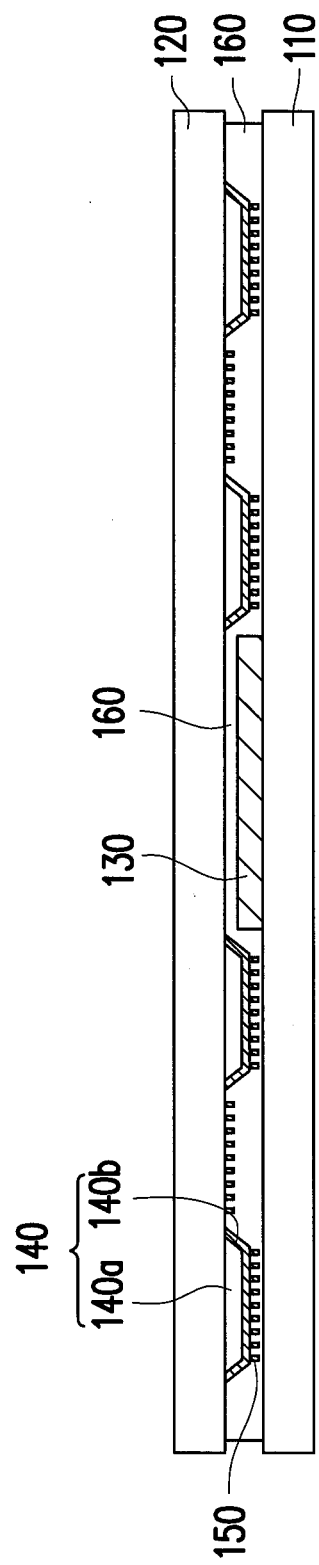

The environmental sensitive electronic device package 100C shown in FIG. 2B is similar to the environmental sensitive electronic device package 100A shown in FIG. 1A, while one of the differences therebetween lies in that the micro-structures 150 of the environmental sensitive electronic device package 100C shown in FIG. 2B are located on the second substrate 120 and the top surfaces of the gas barrier structures 140 close to the first substrate 110. That is, the micro-structures 150 are capable of expanding the contact surface area between the second substrate 120 as well as the gas barrier structures 140 and the filler layer 160, so as to enhance the reliability of the environmental sensitive electronic device package 100C. The micro-structures 150 may be in point, line, or surface contact with or may almost touch the first substrate 110, and thereby possibility of permeation of water vapor/oxygen may significantly decrease.

With reference to FIG. 2C, the environmental sensitive electronic device package 100D shown in FIG. 2C is similar to the environmental sensitive electronic device package 100A shown in FIG. 1A, while one of the differences therebetween lies in that the micro-structures 150 of the environmental sensitive electronic device package 100D shown in FIG. 2C are respectively located on the second substrate 120 and the gas barrier structures 140. The micro-structures 150 described in the present exemplary embodiment are further distributed on the top surfaces of the gas barrier structures 140 close to the first substrate 110 and on the side surfaces of the gas barrier structures 140. That is, the micro-structures 150 are capable of expanding the contact surface area between the second substrate 120 as well as the gas barrier structures 140 and the filler layer 160, so as to enhance the reliability of the environmental sensitive electronic device package 100D. The micro-structures 150 may be in point, line, or surface contact with or may almost touch the first substrate 110, and thereby possibility of permeation of water vapor/oxygen may significantly decrease.

With reference to FIG. 2D, the environmental sensitive electronic device package 100E shown in FIG. 2D is similar to the environmental sensitive electronic device package 100A shown in FIG. 1A, while one of the differences therebetween lies in that the micro-structures 150 of the environmental sensitive electronic device package 100E shown in FIG. 2D are respectively located on the first substrate 110 and the second substrate 120. The micro-structures 150 on the first substrate 110 may be in point, line, or surface contact with or may almost touch the barrier layers 140b of the gas barrier structures 140, and thereby possibility of permeation of water vapor/oxygen may significantly decrease. The micro-structures 150 are able to increase the contact surface area between the first and second substrates 110 and 120 and the filler layer 160, so as to enhance the reliability of the environmental sensitive electronic device package 100E.

Figure 3A:
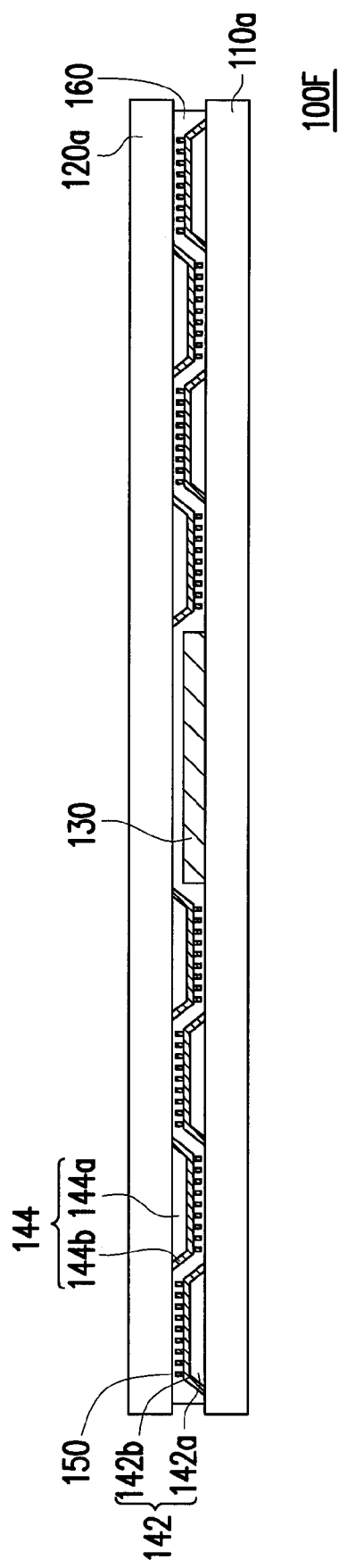
FIG. 3A to FIG. 3D are schematic cross-sectional diagrams illustrating an environmental sensitive electronic device package according to another exemplary embodiment of the disclosure.

With reference to FIG. 3A, the gas barrier structures 140 of the environmental sensitive electronic device package 100F further include first gas barrier structures 142 and second gas barrier structures 144. The first gas barrier structures 142 are located on the first substrate 110a and extended toward the second substrate 120a, and the second gas barrier structures 144 are located on the second substrate 120a and extended toward the first substrate 110a. Each of the first gas barrier structures 142 has a first rib 142a and a first barrier layer 142b that covers the first rib 142a, and each of the second gas barrier structures 144 has a second rib 144a and a second barrier layer 144b that covers the second rib 144a.

The first gas barrier structures 142 and the second gas barrier structures 144 are alternately arranged between the first substrate 110a and the second substrate 120a, and the micro-structures 150 are respectively located on the top surfaces of the first gas barrier structures 142 close to the second substrate 120a and on the top surfaces of the second gas barrier structures 144 close to the first substrate 110a. The micro-structures 150 on the first and second gas barrier structures 142 and 144 may be in point, line, or surface contact with or may almost touch the second substrate 120a and the first substrate 110a, and thereby possibility of permeation of water vapor/oxygen may significantly decrease. The micro-structures 150 are able to increase the contact surface area between the first and second gas barrier structures 142 and 144 and the filler layer 160, so as to enhance the reliability of the environmental sensitive electronic device package 100F.

Figure 3B:
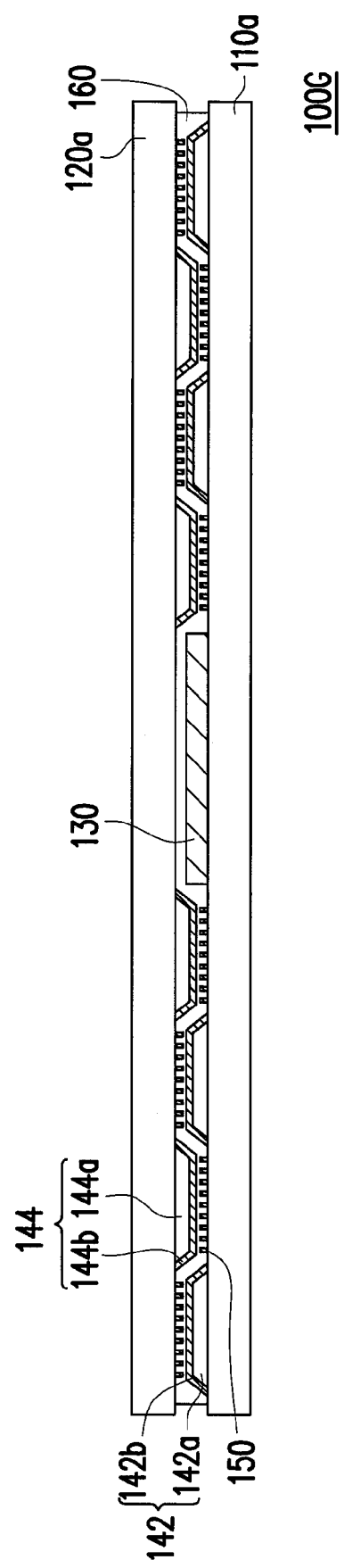

With reference to FIG. 3B, the environmental sensitive electronic device package 100G shown in FIG. 3B is similar to the environmental sensitive electronic device package 100F shown in FIG. 3A, while one of the differences therebetween lies in that the micro-structures 150 of the environmental sensitive electronic device package 100G shown in FIG. 3B are respectively located on the first substrate 110a and the second substrate 120a. The micro-structures 150 on the first substrate 110a may be in point, line, or surface contact with or may almost touch the second barrier layers 144b of the second gas barrier structures 144 on the second substrate 120a; the micro-structures 150 on the second substrate 120a may be in point, line, or surface contact with or may almost touch the first barrier layers 142b of the first gas barrier structures 142, and thereby possibility of permeation of water vapor/oxygen may significantly decrease. The micro-structures 150 are able to increase the contact surface area between the first and second substrates 110a and 120a and the filler layer 160, so as to enhance the reliability of the environmental sensitive electronic device package 100G.

Figure 3C:
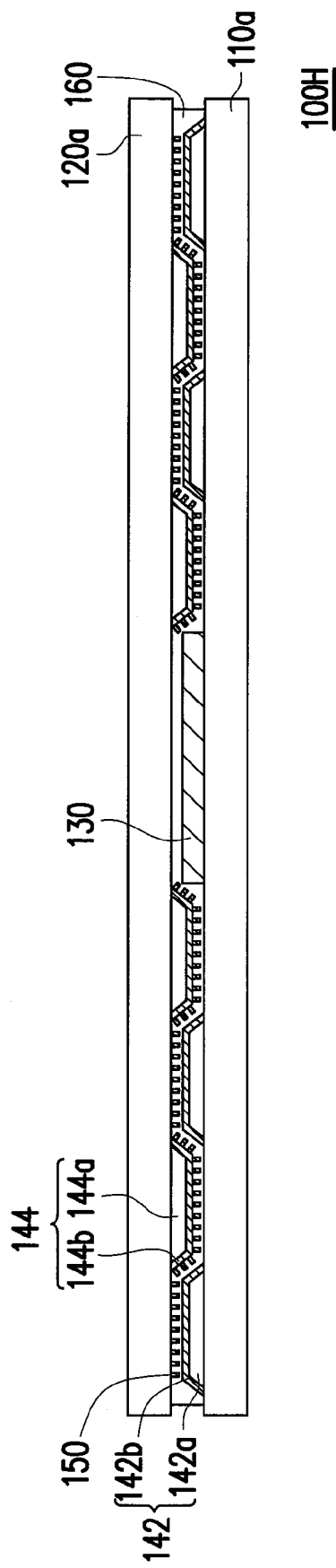

The environmental sensitive electronic device package 100H shown in FIG. 3C is similar to the environmental sensitive electronic device package 100F shown in FIG. 3A, while one of the differences therebetween lies in that the micro-structures 150 of the environmental sensitive electronic device package 100H shown in FIG. 3C are located on the second substrate 120a and the second gas barrier structures 144. The micro-structures 150 are distributed on the top surfaces of the second gas barrier structures 144 close to the first substrate 110a and on the side surfaces of the second gas barrier structures 144. The micro-structures 150 on the second substrate 120a may be in point, line, or surface contact with or may almost touch the first barrier layers 142b of the first gas barrier structures 142; the micro-structures 150 on the second gas barrier structures 144 may be in point, line, or surface contact with or may almost touch the first substrate 110a and the first barrier layers 142b of the first gas barrier structures 142, and thereby possibility of permeation of water vapor/oxygen may significantly decrease. The micro-structures 150 are able to increase the contact surface area between the second substrate 120a as well as the second gas barrier structures 144 and the filler layer 160, so as to enhance the reliability of the environmental sensitive electronic device package 100H.

Figure 3D:
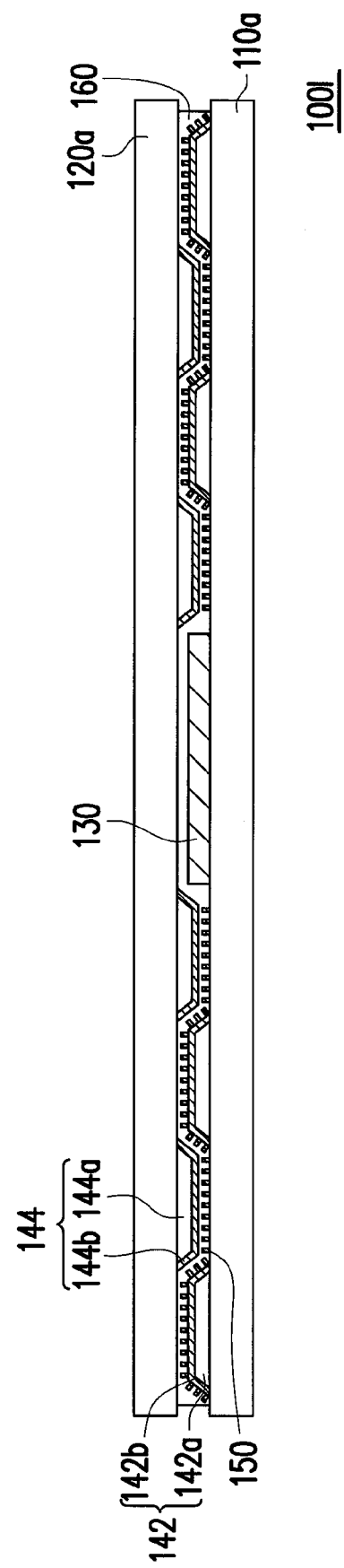

The environmental sensitive electronic device package 100I shown in FIG. 3D is similar to the environmental sensitive electronic device package 100F shown in FIG. 3A, while one of the differences therebetween lies in that the micro-structures 150 of the environmental sensitive electronic device package 100I shown in FIG. 3D are located on the first substrate 110a and the first gas barrier structures 142. The micro-structures 150 are distributed on the top surfaces of the first gas barrier structures 142 close to the second substrate 120a and on the side surfaces of the first gas barrier structures 142. The micro-structures 150 on the first substrate 110a may be in point, line, or surface contact with or may almost touch the second barrier layers 144b of the second gas barrier structures 144; the micro-structures 150 on the first gas barrier structures 142 may be in point, line, or surface contact with or may almost touch the second substrate 120a and the second barrier layers 144b of the second gas barrier structures 144, and thereby possibility of permeation of water vapor/oxygen may significantly decrease. The micro-structures 150 are able to increase the contact surface area between the first substrate 110a as well as the first gas barrier structures 142 and the filler layer 160, so as to enhance the reliability of the environmental sensitive electronic device package 100I.

The above descriptions only provide some exemplary embodiments of the disclosure, in which the environmental sensitive electronic device packages 100A to 100I are exemplified. A manufacturing method of the exemplary environmental sensitive electronic device package 100A depicted in FIG. 1A is elaborated hereinafter with reference to FIG. 4A to FIG. 4E.

Figure 4A:
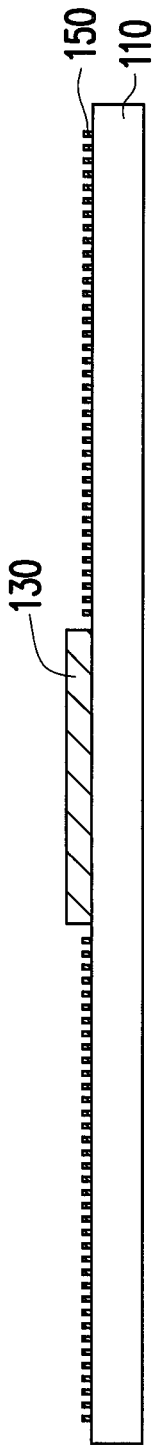

FIG. 4A to FIG. 4E are schematic cross-sectional diagrams illustrating a manufacturing method of an environmental sensitive electronic device package according to an exemplary embodiment of the disclosure. With reference to FIG. 4A, the environmental sensitive electronic device 130 is formed on the first substrate 110. In the present exemplary embodiment, the first substrate 110 is a flexible substrate, for instance, and a material of the flexible substrate may be PET, PEN, PES, PMMA, PC, PI, or metal foil. Besides, the flexible substrate may be equipped with the touch functions, such as a surface capacitive touch substrate, a digital matrix touch substrate (e.g., a projected capacitive touch substrate), or an analog matrix touch substrate. The first substrate 110 may also be a rigid substrate made of glass, which should not be construed as a limitation to the disclosure.

The environmental sensitive electronic device 130 is, for instance, an active environmental sensitive electronic display device or a passive environmental sensitive electronic display device adhered onto the first substrate 110 through an optical adhesive (not shown), for instance. The active environmental sensitive electronic display device is, for instance, an AM-OLED, an AM-EPD commonly known as electronic paper, an AM-LCD, or an AMBPLCD. The passive environmental sensitive electronic display device is, for instance, a PM-OLED or a STN-LCD.

Figures 1, 4B:
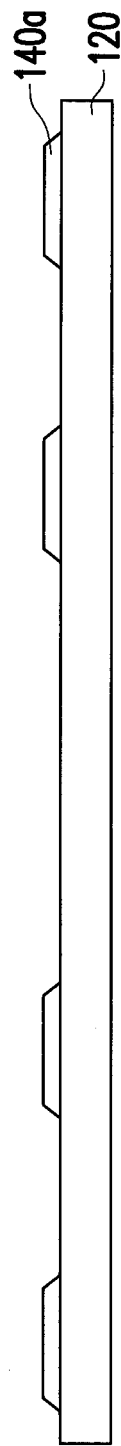
Figures 2, 4B:
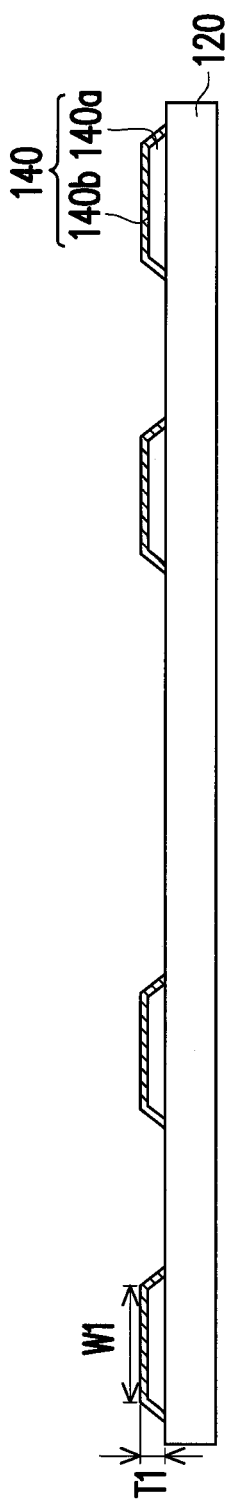

With reference to FIG. 4B-1 and FIG. 4B-2, gas barrier structures 140 are formed on the second substrate 120. Here, the gas barrier structures 140 surround the environmental sensitive electronic device 130, and each of the gas barrier structures 140 has a first height T1 that ranges from 20 micrometers to 25 micrometers, for instance. The gas barrier structures 140 may be formed on at least one side of the environmental sensitive electronic device 130 or formed on any three sides of the environmental sensitive electronic device 130. The gas barrier structures 140 may surround the environmental sensitive electronic device 130. In the present exemplary embodiment, each of the gas barrier structures 140 has a first width W1, and a ratio of the first width W1 to the first height T1 ranges from 4 to 6. A water vapor transmission rate of the gas barrier structures 140 is less than $10^{-2}$ $g/m^2/$day. In a method of forming the gas barrier structures 140, ribs 140a are first formed on the second substrate 120. Here, the ribs 140a may be equidistantly arranged, and a shape of a cross-section of each rib 140a perpendicular to the first substrate 110 may be a rectangular shape, a trapezoidal shape, or a triangular shape. In the present exemplary embodiment, the cross-section of each rib 140a perpendicular to the first substrate 110 has the trapezoidal shape. Barrier layers 140b are then formed on the ribs 140a, and each of the barrier layers 140b covers one of the ribs 140a. So far, the manufacture of the gas barrier structures 140 is done. A material of the ribs 140a includes an inorganic material or a hybrid organic-inorganic material, and a material of the barrier layers 140b includes an inorganic material, e.g., $SiN_x$, $SiO_x$, $SiN_xO_y$, or $Al_2O_3$. The material of the barrier layers 140b is, for instance, Mo, Ti, Al, Cr, Mo/Al/Mo arranged in multiple metallic layers, or Ti/Al/Ti arranged in multiple metallic layers.

In another exemplary embodiment that is not shown herein, the gas barrier structures 140 may have roughened surfaces. To form the gas barrier structures 140 with the roughened surfaces, the ribs 140a with roughened surfaces are first formed on the second substrate 120 by dry etching, wet etching, or sandblasting (that produces a matte finish, and the ribs 140a with the roughened surfaces are then covered by the barrier layers 140b.

With reference to FIG. 4C, micro-structures 150 are formed on the first substrate 110. Here, each of the micro-structures 150 has a second height T2, and a ratio of the second height T2 to the first height T1 ranges from 1/100 to 1/250. The micro-structures 150 are formed on the first substrate 110 through photolithography, X-ray lithography, laser etching, or screen printing, for instance, and each of the micro-structures 150 has a second width W2. A ratio of the second width W2 to the second height T2 ranges from 1/10 to 1. The micro-structures 150 are protrusions with polygonal bottom areas, for instance. As shown in FIG. 1B to FIG. 1D, the bottom areas of the micro-structures 150 described herein may be shaped as a rectangle, a square, or a triangle. That is, the micro-structures 150a shown in FIG. 1B are cuboids with the rectangular bottom areas, the micro-structures 150b shown in FIG. 1C are cubes with the square bottom areas, and the micro-structures 150c shown in FIG. 1D are pyramids with the triangular bottom areas, for instance. In other exemplary embodiments that are not shown herein, the micro-structures 150 may be other types of three-dimensional micro-structures with the bottom areas which are shaped as other types of polygons, circles, or ellipses. As shown in FIG. 2A to FIG. 2D, the micro-structures 150 described herein may be formed on the second substrate 120 and/or the gas barrier structures 140, which may not be construed as limitations to the disclosure.

With reference to FIG. 4D and FIG. 4E, a filler layer 160 is formed on the first substrate 110 to cover the environmental sensitive electronic device 130 and the gas barrier structures 140. In a method of forming the filler layer 160 on the first substrate 110 to cover the environmental sensitive electronic device 130 and the gas barrier structures 140, an adhesive is formed on the first substrate 110 to cover the environmental sensitive electronic device 130 and the gas barrier structures 140. The adhesive is then cured by ultraviolet light or heat to form the filler layer 160, for instance. In the present exemplary embodiment, the adhesive is, for instance, made of acrylic or epoxy resin, and the filler layer 160 is a pressure-sensitive-type adhesive or a fill-type adhesive, for instance.

With reference to FIG. 4E, the second substrate 120 is laminated onto the filler layer 160, such that the first substrate 110 is bonded with the second substrate 120 through the filler layer 160. The environmental sensitive electronic device 130 and the gas barrier structures 140 are located between the first substrate 110 and the second substrate 120. After the second substrate 120 is laminated onto the filler layer 160, the gas barrier structures 140 of the second substrate 120 may be tightly bonded with the first substrate 110 by means of a properly exerted force from a roller or frame press. So far, the environmental sensitive electronic device package 100A is formed. Besides, the structural design or the configuration of the micro-structures described herein may be adjusted in response to the gas left in the adhesive, so as to discharge the remaining gas from the adhesive.

The gas barrier structures 140 are formed on the second substrate 120 in the previous exemplary embodiment, while the gas barrier structures 140 in another exemplary embodiment may also be formed on the first substrate 110. As shown in FIG. 3A to FIG. 3D, the gas barrier structures 140 may include first gas barrier structures 142 formed on the first substrate 110a and second gas barrier structures 144 formed on the second substrate 120a. The first gas barrier structures 142 are extended toward the second substrate 120a, and the second gas barrier structures 144 are extended toward the first substrate 110a. The first gas barrier structures 142 and the second gas barrier structures 144 are alternately arranged between the first substrate 110a and the second substrate 120a.

In a method of forming the first gas barrier structures 142, first ribs 142a are first formed on the first substrate 110a. Here, the first ribs 142a may be equidistantly arranged, and a shape of a cross-section of each first rib 142a perpendicular to the first substrate 110a may be a rectangular shape, a trapezoidal shape, or a triangular shape. In the present exemplary embodiment, the cross-section of each first rib 140a perpendicular to the first substrate 110a has the trapezoidal shape. First barrier layers 142b are then formed on the first ribs 142a, and each of the first barrier layers 142b covers one of the first ribs 142a. So far, the manufacture of the first gas barrier structures 142 is completed. In a method of forming the second gas barrier structures 144, second ribs 144a are first formed on the second substrate 120a. Here, the second ribs 144a may be equidistantly arranged, and a shape of a cross-section of each second rib 144a perpendicular to the first substrate 110a may be a rectangular shape, a trapezoidal shape, or a triangular shape. In the present exemplary embodiment, the cross-section of each second rib 144a perpendicular to the first substrate 110a has the trapezoidal shape. Second barrier layers 144b are then formed on the second ribs 144a, and each of the second barrier layers 144b covers one of the second ribs 144a. So far, the manufacture of the second gas barrier structures 144 is completed.

A material of the first ribs 142a and the second ribs 144a includes an inorganic material or a hybrid organic-inorganic material, and a material of the first barrier layers 142b and the second barrier layers 144b includes an inorganic material, e.g., $SiN_x$, $SiO_x$, $SiN_xO_y$, or $Al_2O_3$. The material of the first barrier layers 142b and the second barrier layers 144b may also be a metallic material, such as Mo, Ti, Al, Cr, Mo/Al/Mo arranged in multiple metallic layers, or Ti/Al/Ti arranged in multiple metallic layers.

According to another embodiment that is not shown, the first gas barrier structures 142 may have roughened surfaces, and so may the second gas barrier structures 144. To form the first gas barrier structures 142 with the roughened surfaces and the second gas barrier structures 144 with the roughened surfaces, the first ribs 142a with roughened surfaces and the second ribs 144a with roughened surfaces are respectively formed on the first substrate 110a and the second substrate 120a through dry etching, wet etching, or sandblasting (that produces a matte finish), for instance. Here, the first ribs 142a on the first substrate 110a and the second ribs 144a on the second substrate 120a may be equidistantly arranged. The first ribs 142a with the roughened surfaces and the second ribs 144a with the roughened surfaces are then covered by the first barrier layers 142b and the second barrier layers 144b, respectively. So far, the manufacture of the first gas barrier structures 142 and the second gas barrier structures 144 is completed.

That is, as shown in FIG. 3A to FIG. 3D, the micro-structures 150 described herein may be formed on the first substrate 110, the second substrate 120, the first gas barrier structures 142, and/or the second gas barrier structures 144, so as to significantly decrease possibility of permeation of water vapor/oxygen may significantly decrease and improve the reliability of the environmental sensitive electronic device packages 100F to 100I.

According to the embodiments of the disclosure, the gas barrier structures described herein are located between the first substrate and the second substrate of the environmental sensitive electronic device package and surround the environmental sensitive electronic device, and the micro-structures are located between the first substrate and the second substrate. Thereby, the surface area of the first substrate, the second substrate, and/or the gas barrier structures in contact with the filler layer is effectively expanded. As such, the reliability of bonding areas in the environmental sensitive electronic device package may be improved, and the first substrate and the second substrate may be prevented from being separated from the environmental sensitive electronic device package in process of bending the environmental sensitive electronic device package.

The micro-structures may be in contact with or may almost touch the first substrate, the second substrate, and/or the gas barrier structures, so as to significantly decrease possibility of permeation of water vapor/oxygen. As such, the environmental sensitive electronic device package described herein is capable of effectively blocking moisture and oxygen, and thereby the environmental sensitive electronic device described herein may have an extended lifetime.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An environmental sensitive electronic device package comprising:
a first substrate;
a second substrate located above the first substrate;
an environmental sensitive electronic device located on the first substrate and between the first substrate and the second substrate;
at least one gas barrier structures located between the first substrate and the second substrate, the gas barrier structures surrounding the environmental sensitive electronic device, each of the gas barrier structures having a first height;
a plurality of micro-structures located between the first substrate and the second substrate, each of the micro-structures having a second height, wherein a ratio of the second height to the first height ranges from 1/250 to 1/100; and
a filler layer located between the first substrate and the second substrate, the filler layer covering the gas barrier structures and the environmental sensitive electronic device.

2. The environmental sensitive electronic device package as recited in claim 1, wherein the micro-structures are located on the first substrate.

3. The environmental sensitive electronic device package as recited in claim 1, wherein the micro-structures are located on the second substrate.

4. The environmental sensitive electronic device package as recited in claim 1, wherein the micro-structures are located on the gas barrier structures.

5. The environmental sensitive electronic device package as recited in claim 1, wherein a water vapor transmission rate of the gas barrier structures is less than $10^{-2}$ g/m$^2$/day.

6. The environmental sensitive electronic device package as recited in claim 1, wherein each of the gas barrier structures has a first width, and a ratio of the first width to the first height ranges from 4 to 6.

7. The environmental sensitive electronic device package as recited in claim 1, wherein each of the micro-structures has a second width, and a ratio of the second width to the second height ranges from 1/10 to 1.

8. The environmental sensitive electronic device package as recited in claim 1, wherein the micro-structures comprise protrusions with polygonal bottom areas.

9. The environmental sensitive electronic device package as recited in claim 1, wherein each of the gas barrier structures comprises:
a rib located on the first substrate or the second substrate; and
a barrier layer covering the rib, the filler layer covering the barrier layer.

10. The environmental sensitive electronic device package as recited in claim 9, wherein the ribs are substantially equidistantly arranged.

11. The environmental sensitive electronic device package as recited in claim 9, wherein a shape of a cross-section of each of the ribs perpendicular to the first substrate comprises a rectangular shape, a trapezoidal shape, or a triangular shape.

12. The environmental sensitive electronic device package as recited in claim 9, wherein a material of the ribs comprises an inorganic material or a hybrid organic-inorganic material.

13. The environmental sensitive electronic device package as recited in claim 9, wherein a material of the barrier layers comprises an inorganic material or a metallic material.

14. The environmental sensitive electronic device package as recited in claim 1, wherein the gas barrier structures comprise:
a first gas barrier structure located on the first substrate and extended toward the second substrate; and
a second gas barrier structure located on the second substrate and extended toward the first substrate, wherein the first gas barrier structure and the second gas barrier structure are alternately arranged between the first substrate and the second substrate.

15. A manufacturing method of an environmental sensitive electronic device package, comprising:
forming an environmental sensitive electronic device on a first substrate;
forming at least one gas barrier structures between the first substrate and the second substrate, wherein the gas barrier structures surround the environmental sensitive electronic device, and each of the gas barrier structures has a first height;
configuring a plurality of micro-structures between the first substrate and the second substrate, each of the micro-structures having a second height, wherein a ratio of the second height to the first height ranges from 1/100 to 1/250;
forming a filler layer on the first substrate to cover the environmental sensitive electronic device and the gas barrier structures; and
laminating the second substrate onto the filler layer, such that the first substrate is bonded with the second substrate through the filler layer, wherein the environmental sensitive electronic device and the gas barrier structures are located between the first substrate and the second substrate.

16. The manufacturing method of the environmental sensitive electronic device package as recited in claim 15, wherein the micro-structures are formed on the first substrate.

17. The manufacturing method of the environmental sensitive electronic device package as recited in claim 15, wherein the micro-structures are formed on the second substrate.

18. The manufacturing method of the environmental sensitive electronic device package as recited in claim 15, wherein the micro-structures are formed on the gas barrier structures.

19. The manufacturing method of the environmental sensitive electronic device package as recited in claim 15, wherein a water vapor transmission rate of the gas barrier structures is less than $10^{-2}$ g/m$^2$/day.

20. The manufacturing method of the environmental sensitive electronic device package as recited in claim 15, wherein each of the gas barrier structures has a first width, and a ratio of the first width to the first height ranges from 4 to 6.

21. The manufacturing method of the environmental sensitive electronic device package as recited in claim 15, wherein each of the micro-structures has a second width, and a ratio of the second width to the second height ranges from 1/10 to 1.

22. The manufacturing method of the environmental sensitive electronic device package as recited in claim 15, wherein the micro-structures comprise protrusions with polygonal bottom areas.

23. The manufacturing method of the environmental sensitive electronic device package as recited in claim 15, wherein a method of forming the micro-structures on the first substrate, the second substrate, and/or the gas barrier structures comprises photolithography or etching.

24. The manufacturing method of the environmental sensitive electronic device package as recited in claim 15, wherein a method of forming the filler layer on the first substrate comprises:
   forming an adhesive on the first substrate to cover the environmental sensitive electronic device and the gas barrier structures; and
   curing the adhesive to form the filler layer.

25. The manufacturing method of the environmental sensitive electronic device package as recited in claim 15, wherein a method of forming the gas barrier structures between the first substrate and the second substrate comprises:
   forming at least one ribs between the first substrate and the second substrate; and
   forming at least one barrier layers to cover the ribs, the filler layer covering the barrier layers.

26. The manufacturing method of the environmental sensitive electronic device package as recited in claim 25, wherein the ribs are substantially equidistantly arranged.

27. The manufacturing method of the environmental sensitive electronic device package as recited in claim 25, wherein the ribs located on the first substrate and the ribs located on the second substrate are alternately arranged.

28. The manufacturing method of the environmental sensitive electronic device package as recited in claim 25, wherein a material of the ribs comprises an inorganic material or a hybrid organic-inorganic material.

29. The manufacturing method of the environmental sensitive electronic device package as recited in claim 25, wherein a material of the barrier layers comprises an inorganic material or a metallic material.

30. The manufacturing method of the environmental sensitive electronic device package as recited in claim 15, wherein the gas barrier structures comprise:
   a first gas barrier structure formed on the first substrate and extended toward the second substrate; and
   a second gas barrier structure formed on the second substrate and extended toward the first substrate, wherein the first gas barrier structure and the second gas barrier structure are alternately arranged between the first substrate and the second substrate.

* * * * *